United States Patent

Forsberg

[11] Patent Number: 5,990,673
[45] Date of Patent: Nov. 23, 1999

[54] DIGITAL PHASE COMPARATOR

[75] Inventor: Gunnar Forsberg, Stockholm, Sweden

[73] Assignee: Telefonaktiebolaget LM Ericsson, Stockholm, Sweden

[21] Appl. No.: 08/765,595

[22] PCT Filed: Jun. 30, 1995

[86] PCT No.: PCT/SE95/00813

§ 371 Date: Jun. 3, 1997

§ 102(e) Date: Jun. 3, 1997

[87] PCT Pub. No.: WO96/01007

PCT Pub. Date: Jan. 11, 1996

[30] Foreign Application Priority Data

Jun. 30, 1994 [SE] Sweden .................................. 9402321

[51] Int. Cl.$^6$ .......................... G01R 23/12; G01R 25/04
[52] U.S. Cl. .................................... 324/76.62; 324/76.52; 324/76.53; 324/76.82
[58] Field of Search .............................. 324/76.47, 76.48, 324/76.52, 76.53, 76.55, 76.62, 76.79, 76.82

[56] References Cited

U.S. PATENT DOCUMENTS

| | | | |
|---|---|---|---|
| 3,760,270 | 9/1973 | Irvin | 324/76.82 |
| 3,764,903 | 10/1973 | Griswold | 324/76.82 |
| 3,989,931 | 11/1976 | Phillips | 235/92 FQ |
| 4,136,559 | 1/1979 | Brown | 324/76.82 X |
| 4,186,597 | 2/1980 | Brown | 324/76.82 X |
| 4,600,994 | 7/1986 | Hayashi | 324/76.82 X |
| 4,704,574 | 11/1987 | Nossen | 324/76.82 |
| 4,972,160 | 11/1990 | Sylvain | 331/1 A |

FOREIGN PATENT DOCUMENTS 0585806  3/1994  European Pat. Off. .
1195466 11/1985  U.S.S.R. .

OTHER PUBLICATIONS

"Properties and design of the Phase–controlled oscillator with a sawtooth comparator," Byrne, C.J., (Mar. 1962), The Bell System Technical Journal, pp. 560–602.

*Primary Examiner*—Glenn W. Brown
*Attorney, Agent, or Firm*—Burns, Doane, Swecker & Mathis, L.L.P.

[57] ABSTRACT

The phase difference of two periodic input signals having essentially the same frequency are measured in, for example, a communication system, in an accurate way with a high resolution and utilizing digital components. A high resolution digital phase detector which can be included in a phase locked loop comprises an oscillator providing a clock signal having a high frequency that is not an integer multiple of the frequency of the input signals. The clock signal is provided to a clock signal input of a counter, and the periodic signals are fed to the start and stop terminals of the counter. Output terminals of the counter are directly connected to inputs of a digital low-pass filter in which an average value calculation is carried out of the integer values of the output of the counter. Because of the small frequency deviation from the integer multiple value, a slow sliding of the oscillator phase compared to the phase of the input signals is achieved, such that all possible integer values on the output of the counter are run through. A very accurate calculation of the phase position is achieved by the average value calculation of these integer values in the low-pass filter. In a complete phase-locked loop, a voltage controlled oscillator provides one of the input signals to the counter through a divider circuit.

15 Claims, 2 Drawing Sheets

DIGITAL PHASE COMPARATOR

TECHNICAL FIELD

The invention relates to a method and a device for measuring with a high resolution and utilizing digital components the phase difference of signals with a high accuracy in a communication system, preferably a telecommunication system.

BACKGROUND

The general need for measuring phase differences between two signals is very old, in particular within the telecommunication area. The problem is usually solved by means of a phase comparator, for example included in a phase-locked loop or PLL. Such a circuit normally comprises a phase comparator PD having input terminals connected to receive the signals the phase of which is to be compared, a loop filter PI, a voltage controlled oscillator VCO and a divider circuit $N_D$, see FIG. 1. The loop filter is often of PI-type, that is it comprises both a proportional part (P) and an integrating part (I). Prior phase comparators were almost always analog or "semianalog". These phase comparators provide as an output signal an analog voltage proportional to the phase difference. A very common type of a semianalog phase comparator is the sawtooth comparator. It comprises an SR-flip-flop triggered at edges of the incoming signals and a low-pass filter. An edge of one of the incoming signals sets the flip-flop in a one position and an edge of the other signal resets the flip-flop. The output square wave is low-pass filtered in for example a simple RC-circuit. The phase position becomes proportional to the output voltage within the phase difference of 0–2π. As regarded over a larger phase interval, the relation between the output voltage and the input phase will have the configuration of a sawtooth, from which the name is derived. A phase-locked circuit having a sawtooth comparator is described in the article "Properties and design of the Phase-controlled oscillator with a sawtooth comparator", Byrne, C. J., (1962), The Bell System Technical Journal, page 599.

Nowadays phase comparators which are constructed entirely of digital circuits are used more and more often. A digital phase comparator provides as an output signal a digital numerical value which is proportional to the phase difference, the digital value being for example an 8-bit word. There exist several reasons for using digital phase comparators. Since phase-locked circuits have very small band widths (<1 Hz), it is difficult or impossible to use analog filters for performing a signal processing which may often be required before the signal is provided to the voltage controlled oscillator VCO. The problem can be solved by providing an AD-converter connected to the output terminal of the analog phase comparator but this solution may be costly, space consuming and sensitive to interference. In a telephone station, also a PLL can be geometrically or geographically distributed; for instance the VCO can be located on one board, the loop filter in a microprocessor on another board and the phase comparator on a third board. In such a distributed PLL of course the signals have to be communicated digitally.

There are several ways of constructing digital phase comparators but a common, prior digital phase comparator, see FIG. 2, comprises an oscillator, or is in any case connected for receiving an available high frequency clock signal, and comprises further a counter. The oscillator is coupled to the counter. Definite edges of the input signals, the phases of which are to be compared, are used, and the edge of one of the signals starts the counter and the edge of the other signal stops the counter. When the counter is stopped, the digital numerical value stored therein constitutes an estimate of the phase difference. Before the next start of the counter it is reset. The loop filter in a PLL requires a numerical value typically 1 to 10 times per second and the input signals to the phase comparator then have significantly higher frequencies, for instance 64 kHz. Then the PLL can command a phase measurement at the time when the loop filter needs a numerical value or the phase comparator can also measure the phase in the same rate as the input frequency, for example at 64 kHz, and the loop filter circuit then takes the last measured value at the time when a value is required.

Digital phase comparators are e.g. disclosed in U.S. Pat. No. 4,972,160 and the published European patent application EP-A2 0 585 806.

SUMMARY

It has previously not been possible to solve in a satisfactory way the problem mentioned above, that is to measure with a high resolution and accuracy and by means of digital circuits/components the phase difference of two signals.

The main problem of the known digital phase comparator is the bad resolution. The resolution in such a phase comparator is in principle determined by the frequency of the oscillator or the system frequency. For example, if this frequency is 20 MHz, the resolution is approximately the inverse value of 20 MHz, that is 50 ns (=nanoseconds). If the period time of the high frequency is designated by T, it may be easily realized that for an ideal counter the measurement error is within the interval (−T, T). The worst case in regard of the measurement resolution is obtained if the high frequency is an integer multiple of the frequency of the signals which are input to the phase comparator. Then the error will slowly fluctuate between −T, 0 and T. Since most systems are synchronous, usually the high frequency is also a multiple of the input frequency to the phase comparator and thus this case is very frequent. It should be observed that herein no distinction is made between phase and time, since the phase can simply be calculated from the time if the frequency of the input signals of the phase comparator is known. Of course, a good resolution can be obtained by means of a conventional digital phase comparator; by increasing the clock frequency to a high value, for example 1 GHz, a resolution of 1 ns is obtained, which can be acceptable. However, such a solution is both costly, power and space consuming and therefore it is not normally of interest.

It is thus an object of the invention to provide a method and device for comparing and measuring accurately and in a high resolution the relative phase positions of two pulse signals by means of digital signal processing and digital components.

It is a further object of the invention to provide a method and device for comparing and measuring the phase difference of two signals in a power efficient, non costly and space saving way.

Another object of the invention is to provide a method and device for providing an output signal indicating the phase difference of two input pulses, where no folding distortion occurs in the output signal.

These objects are achieved by the method and device according to the invention, the details and characteristics of which appear from the specification and the appended claims.

Thus, in a phase comparator a clock signal of a nominally high frequency $f_A$ is provided to the phase comparator, this frequency having some frequency deviation $\Delta f$, where the frequency deviation may be stationary or variable. The pulses in the clock signal are counted, the start and stop of the counting operation being controlled by the same definite position in the pulses of the two signals the phases of which are to be compared, whereafter an averaging operation of the resulting count values is executed. The nominal clock value $f_A$ is then supposed to be an integer multiple of the frequency of the two signals incoming to the phase comparator. A device carrying out the method comprises an oscillator providing the high frequency clock signal, a counter, to the input terminals of which those input signals are connected, the phases of which are to be compared, and a digital low-pass filter connected to the counter output terminals for performing an average calculation.

Two of the essential characteristics of the invention are the small frequency deviation $\Delta f$ of the clock signal and the averaging process. By this frequency deviation, the phase of the clock signal will slide slowly in relation to the phase positions of the signals to be compared. Because of this slow sliding of the phase, the possible integer values of the output signals of the counter will be run through well within a time period, which corresponds to the integration time of the low-pass filter. It should be observed that the slow sliding should still be rapid in relation to the integration time of the low pass filter. By a calculation of the average of these integer values made in the low-pass filter, a very accurate calculated value or estimate of the phase position is obtained.

This method and device have a large importance in the technical area of telecommunication since they may influence, when they are incorporated, the way in which phase and frequency variations are propagated in large and very large telecommunication networks.

No folding distortion occurs of the output signal, since the low-pass filter handles all numerical values from the counter.

Thus, generally the phase difference of two periodic pulse input signals is measured where it is assumed that these signals have essentially the same frequency. Of course there may be a very slight frequency difference apparent e.g. in the displacements of the phase positions of the input signals. A clock signal having a frequency is provided in some way, e.g. generated by a suitable oscillator, this frequency being high compared to that of the input signals. The number of clock signal pulses occurring between a definite pulse position in one of the input signals and a definite pulse position in another one of input signals is counted in a counter, to which the clock signal and the input signals are fed. A definite pulse position means here some predetermined point or narrow region in the pulse shape, for instance an edge or sloping region such as the leading or lagging edge of a rectangular pulse shape.

The clock signal frequency is selected to deviate, for at least most of the time, from being an integer multiple of the frequency of the input signals. Thus the clock signal frequency is the sum of a nominal frequency and a frequency deviation therefrom, where the nominal frequency is an integer multiple of the input signal frequency and the frequency deviation is a small fraction of the nominal frequency. This frequency deviation should however be large, when translated to the input signal frequency, compared to the frequency deviations of the input signals. In a telecommunication system for example, the available frequencies and thus all frequencies used are multiples of some low frequency, so such a deviating clock signal frequency is not easily available but must often be provided by arranging a separate clock oscillator. One condition for selecting the clock signal frequency can then be that it is given a value that is always larger than an integer multiple of the frequency of the input signals and is always less than the next higher integer multiple of this frequency.

By this deviation of the clock signal frequency the phase of the clock signal slides slowly in relation to the phase of the pulse signals, where the sliding velocity advantageously could be high compared to possible changes of the phase positions of the input signals. In the counting operation then all integer values, which could be provided by the counter for the corresponding nominal clock frequency, are in a basically periodical manner run through or provided on the output terminal of the counter. The counting operation is repeated periodically, preferably in the same rate as the frequency of the input signals, so that new counted values are successively provided on the output terminal of the counter.

Then an average of such count values is determined or calculated, the average forming a measure of the phase difference of the pulse signals. The average is performed by a digital low-pass filter connected to the output terminal of the counter and connected to receive count values thereon, e.g. each new counted value or sampling periodically the values provided on the counter output. The averaging operation is thus made as a low-pass filtering or integration having some bandwidth, which should be so large that a number of successive periods of the sliding movement are considered in the averaging operation. The averaging could be performed as calculating periodically the mean value of a predetermined number of last sampled or received count values or some suitably chosen weighted sum of the count values or some other function of the count values which provides a mean.

The frequency deviation of the clock signal may be stationary or fixed in time, may be a sum of a stationary frequency deviation and a stochastic frequency deviation having a mean equal to zero or may even be a stochastic frequency deviation having a mean equal to zero provided that the frequency and amplitude spectrum of the stochastic deviation are such that the clock signal frequency only for very short time periods agrees with an integer multiple of the input frequency and that the sliding movement described above will have a sufficient amplitude. Also the frequency deviation may be a predetermined function of time.

Preferably, the clock signal frequency is sufficiently high, the sampling or receiving rate of the low-pass filter is sufficiently high and the bandwidth of the averaging operation is sufficiently large for avoiding folding or aliasing distortion of the measured phase difference value.

Also, a linearization can be performed immediately before the average calculation step in a linearizer connected in the line between the counter and the low-pass filter, wherein the sawtooth characteristic of the output values of the counter is converted to a linear characteristic by modifying the successive count values output from the counter. Thus the modified values do not include differences between two consecutive count values, which have a magnitude exceeding a predetermined threshold value. When such a large jump or difference of consecutive counted numbers occurs, it is detected by the linearizer and a modification is made by adding to or subtracting from the latest count value a positive count value which corresponds to a full period of the input signals or which is strictly the limit count value obtained when the phase difference of the pulse signals approaches a full period of these signals. Then the same addition or subtraction is made for all successive counted values until a new jump is detected.

The averaging operation in a digital low-pass filter and the linearization of the count values can also be used in a standard phase comparator.

BRIEF DESCRIPTION OF THE DRAWINGS

The method and device according to the invention will be described in more detail hereinafter by way of an exemplary, non-limiting embodiment and with reference to the accompanying drawings in which.

DETAILED DESCRIPTION

Figure 1:
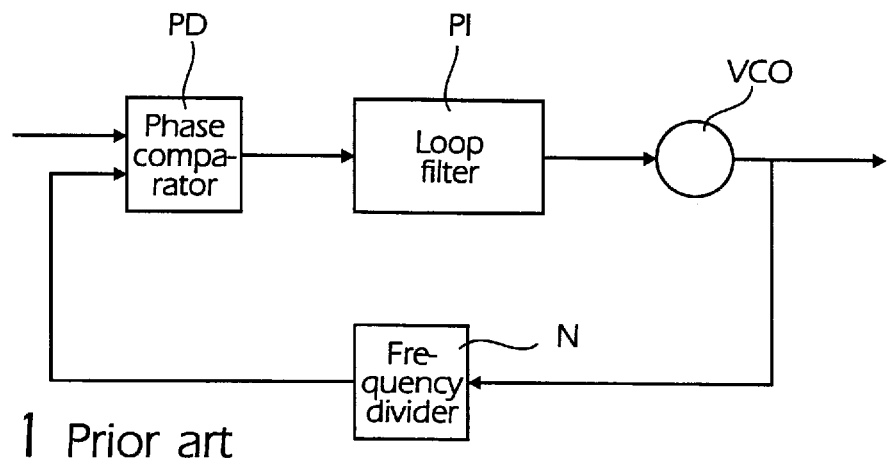
FIG. 1 is a block diagram of a prior art phase-locked circuit PLL using an analogue phase comparator.

FIG. 1 is a diagram of a prior phase-locked circuit PLL, which has been briefly described above and comprises an analog phase comparator PD, to the input terminals of which those two input signals are connected, the phases of which are to be compared. The output terminal of the phase comparator PD is connected to a loop filter PI, the output terminal of which in turn is connected to the input terminal of a voltage controlled oscillator VCO. The output terminal of the VCO is through a feedback line connected to a frequency divider $N_D$, the output terminal of which is connected to one input of the phase comparator PD as one of the signals, which are to be compared.

Figure 2:
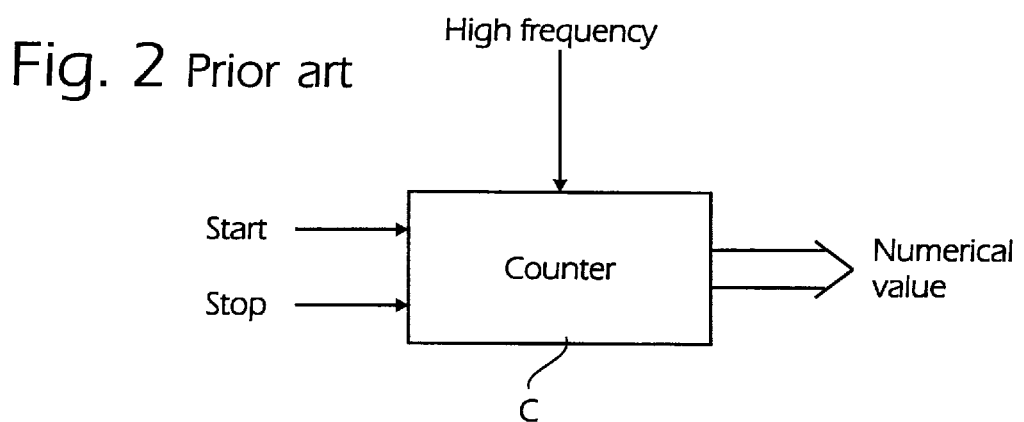
FIG. 2 is a very schematic diagram of a prior art digital phase comparator.

FIG. 2 is a picture of a prior art digital phase comparator, which has also been discussed above. A counter C receives on its start and stop terminals the pulse signals, the phases of which are to be compared, the counter being clocked by a high frequency pulse signal from e.g. an oscillator for providing a numerical value on the output terminal of the counter C.

Figure 3:
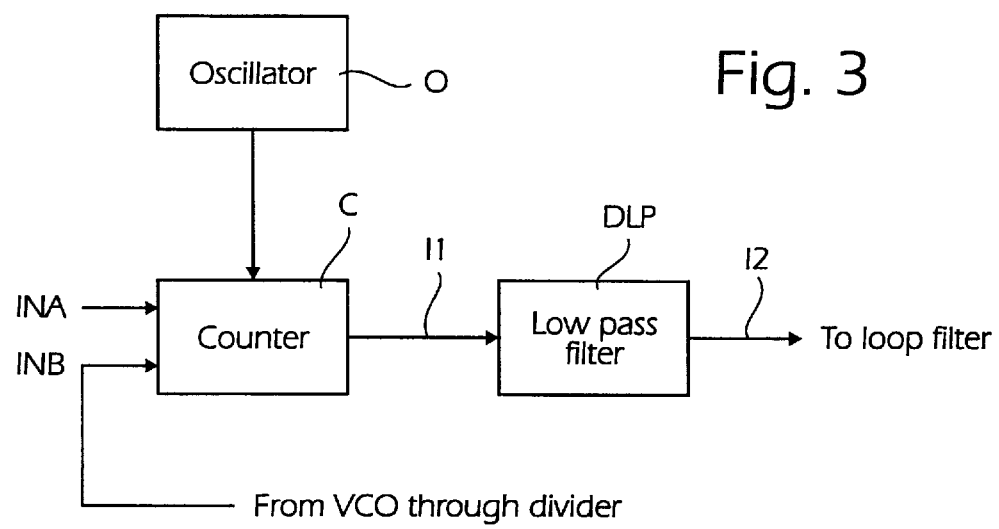
FIG. 3 is a block diagram of a phase comparator using a clock signal having a frequency deviation, the phase comparator being drawn for use in a PLL.

A phase comparator is normally part of a larger apparatus or system. For instance, it can be included in a phase-locked circuit PLL, which in turn can be included in a subsystem or a system of a higher level, e.g. in a telecommunication network. It is possible to implement the high-precision digital phase comparator described herein as for instance a gate array or as a gate array combined with a microprocessor. The phase comparator can be constructed completely of hardware, but for cost reasons it can be advantageous to divide it in a hardware part and a software part, where some characteristics of the operation of the comparator are determined by a program. FIG. 3 is a block diagram of a high resolution digital phase comparator and it is illustrated as being part of a phase-locked circuit PLL. The phase comparator comprises a start-stop counter C and to the input terminals thereof input or incoming pulse or periodic signals INA and INB are provided, where the signal INA is some signal originating from another circuit, not shown, and the signal INB is a feed-back signal fed back from a voltage controlled oscillator VCO, not shown, through a frequency divider circuit, not shown, which for a division number equal to 1 can be constituted by a direct connection lead. The counter C receives also a high frequency clock signal having the frequency $f_O$ from an oscillator O. The clock signal frequency $f_O$, which is chosen in a special way, is a high frequency and contains a small frequency deviation or frequency offset $\Delta f$ from an integer multiple of the frequency of the signals to be compared. The output signals of the output terminal I1 of the counter C which are binary count values are on a line fed to a digital low-pass filter DLP where an average value of count values is calculated, e.g. in a simple case the arithmetic mean of always a predetermined number of count values is calculated. The resulting binary value is provided on the output terminal I2 of the low-pass filter DLP to a loop filter, not shown, in the PLL.

The low-pass filter DLP works suitably at the frequency $f_i$, which is the system frequency and also the frequency of an incoming signal and thus the frequency at which the phase comparison is made. It means also that the counter C works all the time without pauses, not considering the pause between stop and start edges of the input signals. Since the low-pass filter/counter must work at a frequency which is much higher than the PLL bandwidth, the frequency is preferably equal to $f_i$. For instance, it can be mentioned, that when $f_i$ is typically 64 kHz, the PLL bandwidth is typically only 0.1 Hz. Because 64 kHz must still be considered a very slow frequency for a digital low-pass filter DLP, actually no advantages at all are obtained in the case where the frequency is for example lower than $f_i$. The device can work at a lower frequency but not as optimally as at $f_i$.

An oscillator O according to FIG. 3 has the frequency $$f_O = f_A + \Delta f$$

where $f_O$ is the oscillator frequency, $f_A$ is a nominal oscillator frequency and $\Delta f$ is a frequency deviation. Furthermore $$f_A = N \cdot f_i$$

where $f_i$ is the nominal frequency of the input signals, N is the quotient of nominal oscillator frequency $f_A$ and nominal input frequency $f_i$ and N is an integer>1 for which it should generally be true that $$N \leq 2^M$$

where

M is the number of bits provided from the counter. A typical value is M=8, which for a normal construction gives: $N=2^M=256$.

If $N<2^M$ the counter C is not used completely, that is the counter is unnecessarily large. If $N>2^M$ the counter is not sufficient for counting the phase difference of the signals for large phase differences what may result in erroneous calculations. For a safe or optimal construction therefore $N=2^M$ should be chosen. In the use of an 8-bit counter, M=8, therefore N=256.

$\Delta f$ is in the illustrated embodiment a stationary positive or negative frequency deviation, which is usually only some hundred ppm (parts per million) of $f_A$, which can for example correspond to about 3 kHz in frequency, that is a small fraction of the input frequency of 64 kHz. It is also possible to vary $\Delta f$ in time.

It can be mentioned that the low-pass filter DLP shall have a lowest possible limit frequency in order to obtain a high resolution. However, this limit frequency may not be close to the limit frequency of the PLL because then the PLL will be instable due to a reduced phase marginal in the control loop. As a rough rule of thumb it can be said that the limit frequency of the low-pass filter DLP should be at least 3 times the limit frequency of the phase-locked circuit PLL. It should be remarked that the digital phase comparator described herein is not restricted to be used only connected to a PLL but is also useful in all applications where a phase comparison of signals is to be made.

It can also be mentioned that the number of bits from the output terminal I2 of the low-pass filter DLP should be significantly higher than the corresponding number from the output terminal I1 of the counter C in order to obtain a high resolution in the phase measurement.

Actually, the phase comparator according to FIG. 3 is a sawtooth comparator comprising the linear range 0–2π; it is also true for the conventional digital phase comparator of FIG. 2.

In the following it is assumed, if nothing else is said, that $N=2^M$.

If the input signals to the phase comparator of FIG. 3 has a phase difference of exactly π, the ideal count value R is according to the below:

$$R=(f_A+\Delta f)/(2 \cdot f_i)$$

Assume as an example the following input parameters:

M=8

$f_i$=64 kHz $f_A$=N·$f_i$=$2^M$·$f_i$=16.384 MHz

Δf=200·10⁻⁶·16.384 MHz=3276.8 Hz (+200 ppm deviation is assumed)

The parameter values above inserted in (1) gives:

R=128.0256 (after the averaging process)

The deviation from 128.0 depends on the frequency deviation Δf.

If we define T=1/($f_A$+Δf), i.e. T is the period time of the oscillator O, the actual difference expressed in time of the phases of the input signals is then R·T=1/(2·$f_i$), which corresponds exactly to π as is expected.

It appears now that R corresponds to the numerical value that the digital low-pass filter DLP is to deliver, if the phase comparator works perfectly, without any error in the phase measurement, and if the input phase difference is exactly π.

Because PLLs often have a nominal phase difference of π the value of R above can be considered as a so called zero reference. In other words, from the actual numerical value F on the output terminal I2 of the low-pass filter DLP, the reference R=128.0256 is subtracted for obtaining a deviation from the nominal phase position. It is more comfortable to express phase in time and therefor multiply the deviation defined above by T. It can be expressed as:

$$\Delta t=(F-R) \cdot T \quad (2)$$

It can now be interesting to display examples how the actual signal on the output terminal I1 of the comparator C looks as a function of time. We assume that the parameter values are as above and that the phase difference of the input signals INA and INB is exactly π. In a simulation the following values are obtained on the output terminal I1 of the comparator C:

128, 128, 128, . . . , 128, (38 times), 129, 128, 128, 128 . . . , 128 (38 times), 129 and so forth.

The pattern is thus 38 values of 128 followed by 1 value of 129. If the average value of this repeated pattern is calculated, the following value is obtained:

$$(38 \cdot 128+129)/39=128.025641$$

If the value above is inserted in (2) a phase difference of 2.5 ps (picoseconds) is obtained, which must be considered as extremely small considering that the conventional phase comparator according to FIG. 2 gives an error which can be equal to T, that is about 61 ns.

However, it should be observed that the pattern described above is sometimes interrupted by long or short sequences of the value of 128. If the average is formed over 10 ms, the error is instead 39 ps, which is still about 1000 times better than the conventional phase comparator according to FIG. 2.

If the phase position of the signals is changed to be a little larger than π, for instance the following sequence is obtained according to simulations: 128, 128, . . . , 128, (10 times), 129, 129, . . . , 129 (10 times), 128, 128, . . . , 128, (9 times), 129, 129, . . . , 129 (11 times) . . . .

A great advantage of the digital phase comparator described herein which has only been mentioned briefly above is that the phase comparator has no folding or aliasing distortion in contrast to conventional phase comparators according to FIG. 2. Generally folding or folding-back distortion means that high frequencies are "folded down" to lower frequencies, depending on the fact that the suppositions of the sampling theorem are not satisfied. We can consider the prior phase comparator of FIG. 2 and assume that the input signals of for example 64 kHz are phase modulated by 100 Hz. If the digital output value from the counter C is accessed at the frequency 10 Hz, there exists a risk of measuring all the time the peak amplitude of the phase modulation, which gives a constant error that is equal to the amplitude of the phase modulation. Because of the low-pass filter 3, which uses all numerical values from the output terminal I1, this problem does not arise in the digital phase comparator device as described herein.

For other applications than phase-locked circuits, in extremely seldom cases in solutions having a fixed frequency deviation Δf some non-desired errors can occur in the phase measurement and result in measurement errors. These measurement errors can be reduced by the way that Δf is caused to vary in time. First it can be mentioned that the oscillator O in FIG. 3 is not necessarily a physical oscillator but also can be a frequency arriving from the outside or be some similar means. Often a microprocessor is used, the clock frequency of which is determined by a crystal. By choosing a suitable frequency for this crystal the frequency is in a way obtained for free if we suppose that the frequency of the input signals is known in advance.

Several embodiments can be obtained by varying the properties of the frequency deviation Δf. The fundamental embodiment of Δf is a fixed frequency device, which is however very well allowed to vary a little due to temperature variations, aging and other factors. Δf should be chosen so that ($f_A$+Δf)/N always is larger or alternatively always less than the actual frequencies of the signals input to the phase comparator.

An alternative embodiment is to superpose on Δf a small stochastic variation of the frequency. The advantage thereof is that phase measurements by the comparator C are then only made in the neighbourhood of a critical point during a short time, and thus the probability of the measurement errors mentioned earlier would be still lower than for a fixed frequency deviation. The same effect can be achieved by means of a deterministic frequency variation or a combination.

As has been mentioned earlier, the phase comparator according to FIG. 3 is of sawtooth type, that is the output signal as a function of the input phase is in the shape of an infinite number of ramps between . . . −4π−−2π, −2π–0, 0–2π, 2π–4π . . . . Between the ramps the characteristic curve extends along a vertical line downwards or upwards, that is we have a sawtooth function. A solution according to FIG. 3 has a linear range, which is to some extent limited. It does not depend on the fact that the counter has a limited number of bits what could be assumed, but on the fact that the counter all the time is stopped before it has time to count sufficient long because the stop pulse stops the counting at maximally 2π. For oscillatory settling situations or for extremely large phase variations in the signals input to the phase comparator it is desirable to have a significantly larger linear range. For a limited linear range there exists a risk that a PLL does not lock on the incoming frequencies, particularly in the start of the system. Such an extended linear range can simply be accomplished if it is assumed in advance that extremely large and rapid phase jumps cannot occur, which is a reasonable supposition since such situations do not normally occur in for instance a telecommunication system. For solving the problem the output terminal of the counter C is connected to a device performing a linearization. If for instance the output signal from the original counter is: 250, 254, 1, 3, the device it to translate these numbers into 250, 254, 257, 259. In this way an arbitrary large linear range can be obtained both in the positive and the negative directions. In order that the linearization will work well, it is important that the condition $N=2^M$ is true.

Figure 4:
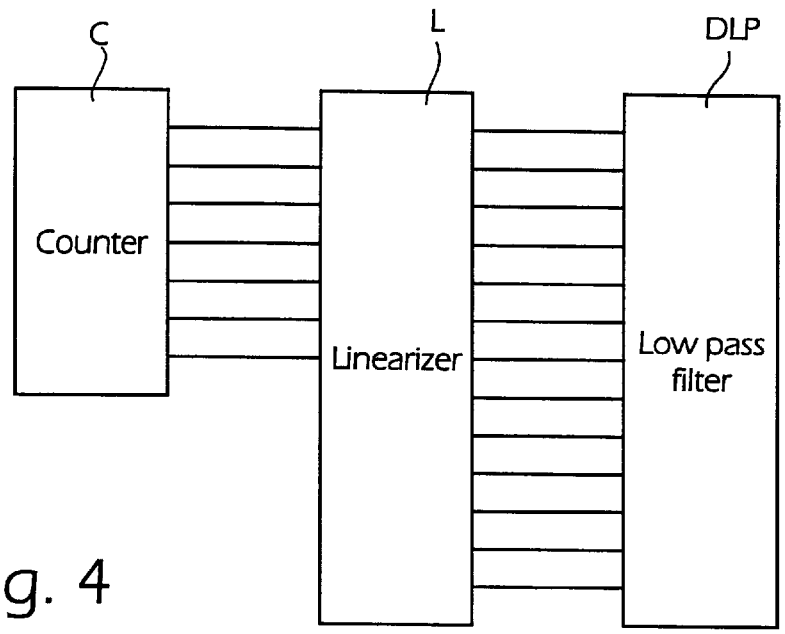
FIG. 4 is a block diagram illustrating a linearization circuit inserted between a counter and a digital low-pass filter.
Figure 5:
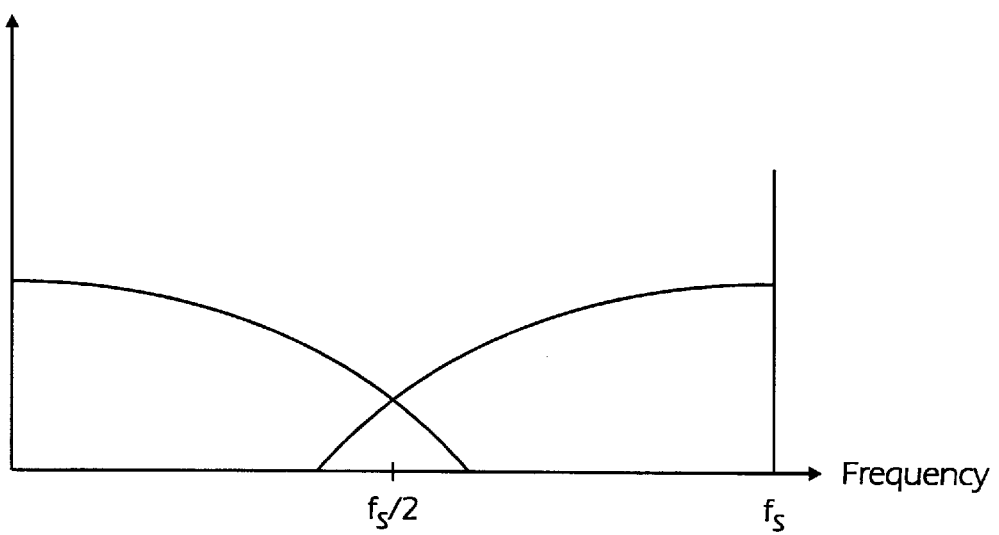
FIG. 5 is a diagram illustrating an example of folding distortion, showing the phase spectrum, that is the detected phase differences of two signals as a function of frequency.

A solution of the problem is illustrated by a construction indicated in the block diagram of FIG. 4 and for this construction the linear part of the output signal can be arbitrarily larger or less than 0–2π (calculated for 64 kHz). More particularly the linear part is ±N·2π, where the integer value N can be chosen arbitrarily. Large N-values imply however more silicon surface, and thus one has to determine a suitable value of N.

According to FIG. 2 an 8-bit counter is shown which provides an 8-bit word 64000 times per second. The word enters a digital low-pass filter having the bandwidth of 1 Hz.

The 8-bit word corresponds to a decimal number, which can vary between 0–255. In normal operation sudden transitions cannot occur between a number near 255 and a number near 0. The construction of FIG. 4 achieves that a sudden transition from for instance 254 to 3 is interpreted as the new number 259 (=3+256). Similarly, a sudden transition between for example 5 and 253 is to be interpreted as −3 (=253−256). The rule is that if the number suddenly increases, 256 is subtracted from the new number, and if the number suddenly is reduced, 256 is added to the new number. Thus a linearizer L is connected in the line between the counter C and the low-pass filter DLP. The linearizer L contains comparator circuits and addition and subtraction logic. Since the numerical range is extended by the linearizer L, the low-pass filter DLP must have more input lines than output lines from the counter C. The device described illustrates one embodiment. Of course it is also possible to perform the linearization by means of software in for instance a microprocessor.

The sudden decreases or increases must be larger than some predetermined threshold value for making the addition or the subtraction respectively. For an 8 bit counter C the threshold value could have a large value near the upper limit of possible values in the counter C, say for instance equal to 253 or more. However, also smaller threshold values can be used, in particular for a hard-ware linearizer L. A simple solution is if the decrease or increase is between a number ≧240 (the binary number 1111xxxx) to a number ≦15 (the binary number 0000xxxx), an addition or a substraction respectively is made. It can be expressed in standard software language (binary numbers)

```
IF A_{N-1} ≧ 1111XXXX AND A_N ≦ 0000XXXX
THEN B_N = B_{N-1} + 100000000
IF A_{N-1} ≦ 0000XXXX AND A_N ≧ 1111XXXX
THEN B_N = B_{N-1} − 100000000
ELSE B_N = B_{N-1}
C_N = B_{N-1}
```

The number $C_N$ is the number which enters the digital low-pass filter DLP. The parameter $B_N$ is only an internal auxiliary parameter, which is equal to zero at the start, that is for voltage on. Below is given a numerical example of the algorithm.

| $A_N$ | $B_N$ | $C_N$ |
|---|---|---|
| 250 | 0 | 250 |
| 254 | b | 254 |
| 1 | 256 | 257 |
| 3 | 256 | 259 |
| — | — | — |
| 254 | 256 | 510 |
| 255 | 256 | 511 |

-continued

| $A_N$ | $B_N$ | $C_N$ |
|---|---|---|
| 0 | 512 | 512 |
| 5 | 512 | 517 |
| — | — | — |
| 1 | 512 | 513 |
| 252 | 256 | 508 |
| 2 | 256 | 258 |
| 255 | 0 | 255 |
| — | — | — |
| 2 | 0 | 2 |
| 254 | −256 | −2 |

As is seen, $C_N$ can with the algorithm above vary between −∞ to +∞. The possible values of $C_n$ must be restricted since the following digital low-pass filter can not handle arbitrarily large numbers.

What is claimed is:

1. A method for measuring a phase difference between two periodic pulse signals having substantially the same frequency, the method comprising the steps of:

providing clock signal pulses having a clock signal frequency deviating from being an integer multiple of said same frequency of the two periodic pulse signals to make a phase of the clock signal pulses slowly slide in relation to phases of the two periodic pulse signals, counting the number of clock signal pulses occurring between a definite pulse position in one of the two periodic pulse signals and a definite pulse position in another one of the two periodic pulse signals, repeating periodically the counting operation in the step of counting the number of clock signal pulses, and finally determining an average of counted numbers, the average forming a measure of the phase difference of the pulse signals.

2. The method of claim 1, wherein the clock signal frequency is a sum of a nominal frequency and a deviation frequency deviating from the nominal frequency, the nominal frequency being an integer multiple of said same frequency of the two periodic pulse signals and the deviation frequency being a relatively small fraction of the nominal frequency, and the deviation frequency is a sum of a stationary deviation frequency and a stochastic deviation frequency, the stochastic deviation frequency having a mean equal to zero.

3. The method of claim 1, wherein the clock signal frequency is a sum of a nominal frequency and a deviation frequency deviating from the nominal frequency, the nominal frequency being an integer multiple of said same frequency of the two periodic pulse signals and the deviation frequency being a relatively small fraction of the nominal frequency, and the deviation frequency is a predetermined function of time.

4. The method of claim 1, wherein the clock signal frequency is always larger than an integer multiple of said same frequency of the two periodic pulse signals and is always less than the next higher integer multiple of said same frequency.

5. The method of claim 1, wherein the clock signal frequency is sufficiently high and the bandwidth of the averaging operation in the step of determining an average of counted numbers is sufficiently large for avoiding folding distortion of the measure of the phase difference of the two periodic pulse signals.

6. The method of claim 1, further comprising a step of, immediately before the step of determining an average of counted numbers, converting a sawtooth characteristic of the counted numbers to a linear characteristic by modifying the successively counted numbers so that there are no differences between two consecutive counted numbers, which have a magnitude exceeding a predetermined threshold value, the modification being made by adding to or subtracting from, when such a difference is detected, the latest counted number and the counted numbers that follow, that positive counted number which is the limit counted number obtained when the phase difference of the periodic pulse signals approaches a full period.

7. A device for measuring a phase difference between two periodic pulse signals having substantially the same frequency, the device comprising:

a clock signal source for generating a clock signal having a clock signal frequency deviating from being an integer multiple of said same frequency of the two periodic pulse signals, the clock signal frequency being chosen to make a phase of the clock signal slowly slide in relation to phases of the two periodic pulse signals, a counter connected to the clock signal source for counting clock pulses in the clock signal to provide counted values, the counter further connected to receive the two periodic pulse signals, the counting operation being started by a definite pulse position in one of the two periodic pulse signals and stopped by a definite pulse position in another one of the two periodic pulse signals, a digital low-pass filter connected to an output of the counter for receiving the counted values or for sampling the counted values and for determining an average value of the successively received or sampled values, the average value representing the phase difference, and for providing on an output terminal a signal representing the average value and thereby the phase difference, whereby, for successively made counting operations of pulses in the counter, each possible integer counted value output from the counter is run through to make the average value determined by the digital low-pass filter have an increased accuracy.

8. The device of claim 7, wherein the clock signal source is arranged to provide a clock signal having a clock signal frequency being a sum of a nominal clock signal frequency and a relatively small deviation frequency, the nominal clock signal frequency being an integer multiple of said same frequency of the two periodic pulse signals and the deviation frequency being a sum of a stationary deviation frequency and a stochastic deviation frequency, the stochastic deviation frequency having a mean equal to zero.

9. The device of claim 7, wherein the clock signal source is arranged to provide a clock signal having a clock signal frequency being a sum of a nominal clock signal frequency and a relatively small deviation frequency, the nominal clock signal frequency being an integer multiple of said same frequency of the two periodic pulse signals and the deviation frequency being a predetermined function of time.

10. The device of claim 7, wherein the clock signal source is arranged to provide a clock signal having a clock signal frequency always larger than an integer multiple of said same frequency of the two periodic pulse signals and always smaller than the next higher integer multiple of said same frequency.

11. The device of claim 7, wherein the digital low-pass filter is arranged to receive counted values from the counter to be used in the determining of the average value at a rate equal to said same frequency of the two periodic pulse signals.

12. The device of claim 7, wherein the clock signal frequency is sufficiently high, the receiving or sampling rate of the low-pass filter is sufficiently high and the bandwidth of the low-pass filter is sufficiently large or the integration time of the digital low-pass filter is sufficiently long or the number of values used in the determining of the average value is sufficiently large for avoiding a folding distortion of the average values representing the phase difference.

13. The device of claim 7, further comprising a linearization circuit connected between an output terminal of the counter and an input terminal of the low-pass filter, the linearization circuit being arranged to convert a sawtooth characteristic of the counted values output from the counter to a linear characteristic.

14. A phase-locked circuit comprising:

a device for measuring a phase difference between two periodic pulse signals having substantially the same frequency, the device comprising:

a clock signal source for generating a clock signal having a clock signal frequency deviating from being an integer multiple of said same frequency of the two periodic pulse signals, the clock signal frequency being chosen to make a phase of the clock signal slowly slide in relation to phases of the two periodic pulse signals, a counter connected to the clock signal source for counting clock pulses in the clock signal to provide counted values, the counter further connected to receive the two periodic pulse signals, the counting operation being started by a definite pulse position in one of the two periodic pulse signals and stopped by a definite pulse position in another one of the two periodic pulse signals, a digital low-pass filter connected to an output of the counter for receiving the counted values or for sampling the counted values and for determining an average value of the successively received or sampled values, the average value representing the phase difference, and for providing on an output terminal a signal representing the average value and thereby the phase difference, a loop filter, a voltage controlled oscillator, and a frequency divider.

15. The phase-locked circuit of claim 14, wherein, to obtain a resolution which is as high as possible, the digital low-pass filter has a lowest possible limit frequency, the limit frequency being at least 3 times higher than a limit frequency of the phase-locked circuit.

* * * * *